US008418387B2

(12) United States Patent
Swatt et al.

(10) Patent No.: US 8,418,387 B2
(45) Date of Patent: Apr. 16, 2013

(54) ISOLATED ACCESS ASSEMBLY FOR BACK-TO-BACK ELECTRONIC DISPLAY AND STATIC DISPLAY

(75) Inventors: Bill Swatt, Alpharetta, GA (US); William R. Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 114 days.

(21) Appl. No.: 12/833,514

(22) Filed: Jul. 9, 2010

(65) Prior Publication Data

US 2011/0134356 A1 Jun. 9, 2011

Related U.S. Application Data

(63) Continuation-in-part of application No. 12/618,104, filed on Nov. 13, 2009, now Pat. No. 8,310,824.

(51) Int. Cl.
*G09F 15/00* (2006.01)
*H05K 5/00* (2006.01)

(52) U.S. Cl.
USPC .............. 40/606.18; 40/549; 40/564; 40/574; 361/679.21

(58) Field of Classification Search ............. 361/679.04, 361/679.06, 679.07; 40/549, 606.18
See application file for complete search history.

(56) References Cited

U.S. PATENT DOCUMENTS 4,093,355 A 6/1978 Kaplit et al.
4,547,987 A 10/1985 Stilling
4,593,978 A 6/1986 Mourey et al.
4,634,225 A 1/1987 Haim et al.
4,905,390 A * 3/1990 Stilling .......................... 40/549
5,029,982 A 7/1991 Nash
5,088,806 A 2/1992 McCartney et al.
5,247,374 A 9/1993 Terada
(Continued)

FOREIGN PATENT DOCUMENTS

JP 03153212 7/1991
JP 08194437 7/1996
(Continued)

OTHER PUBLICATIONS

Zeef, Hubing, EMC analysis of 18' LCD Monitor, Aug. 2000, 1 page.

*Primary Examiner* — Zachary M Pape
(74) *Attorney, Agent, or Firm* — Standley Law Group LLP

(57) ABSTRACT

An isolated access assembly for a back-to-back electronic display and static display setup. A central housing contains an electronic display with a static display being hingedly attached to the central housing on the opposite side of the electronic display. The static display can rotate to allow access to the rear of the electronic display without permitting access to the static display itself. A front door may be hingedly attached to the central housing and placed in front of the electronic display to allow the front portion of the electronic display to be accessed and serviced. A rear door may be hingedly attached to the static display to allow the static display to be accessed and serviced. A first locking mechanism may control access to the rear portion of the electronic display while a second locking mechanism may control access to the front portion of the electronic display. A first advertising party may be given proper access to the first and second locking mechanisms. A third locking mechanism may control access to the static display. A second advertising party may be given proper access to the third locking mechanism.

17 Claims, 9 Drawing Sheets

U.S. PATENT DOCUMENTS

| | | | | |
|---|---|---|---|---|
| 5,559,614 | A | 9/1996 | Urbish et al. | |
| 5,729,289 | A | 3/1998 | Etoh | |
| 5,748,269 | A | 5/1998 | Harris et al. | |
| 5,767,489 | A | 6/1998 | Ferrier | |
| 5,818,010 | A | 10/1998 | McCann | |
| 5,835,179 | A | 11/1998 | Yamanaka | |
| 6,089,751 | A | 7/2000 | Conover et al. | |
| 6,157,432 | A | 12/2000 | Helbing | |
| 6,191,839 | B1 | 2/2001 | Briley | |
| 6,417,900 | B1 | 7/2002 | Shin et al. | |
| 6,535,266 | B1 | 3/2003 | Nemeth et al. | |
| 6,628,355 | B1 | 9/2003 | Takahara | |
| 6,839,104 | B2 | 1/2005 | Taniguchi et al. | |
| 6,885,412 | B2 | 4/2005 | Ohnishi et al. | |
| 6,943,768 | B2 | 9/2005 | Cavanaugh et al. | |
| 7,334,361 | B2 | 2/2008 | Schrimpf | |
| D608,775 | S * | 1/2010 | Leung | D14/307 |
| 8,116,081 | B2 * | 2/2012 | Crick, Jr. | 361/724 |
| 2002/0101553 | A1 | 8/2002 | Enomoto et al. | |
| 2002/0126248 | A1 | 9/2002 | Yoshida | |
| 2003/0007109 | A1 | 1/2003 | Park | |
| 2004/0036834 | A1 | 2/2004 | Ohnishi et al. | |
| 2004/0103570 | A1 * | 6/2004 | Ruttenberg | 40/584 |
| 2004/0165139 | A1 | 8/2004 | Anderson et al. | |
| 2007/0267554 | A1 | 11/2007 | Tannas | |
| 2007/0268201 | A1 | 11/2007 | Sampsell | |
| 2008/0100186 | A1 * | 5/2008 | Li | 312/223.2 |
| 2008/0304219 | A1 * | 12/2008 | Chen | 361/681 |
| 2009/0009041 | A1 * | 1/2009 | Zeidler | 312/263 |
| 2009/0267866 | A1 | 10/2009 | Reddy | |
| 2011/0058326 | A1 * | 3/2011 | Idems et al. | 361/679.21 |
| 2011/0227467 | A1 * | 9/2011 | Foppe et al. | 312/236 |

FOREIGN PATENT DOCUMENTS

| | | |
|---|---|---|
| JP | 11160727 | 6/1999 |
| JP | 2002158475 | 5/2002 |
| JP | 2005134849 | 5/2005 |
| JP | 2008046435 | 2/2008 |
| KR | 1020070070675 | 7/2007 |

* cited by examiner

ISOLATED ACCESS ASSEMBLY FOR BACK-TO-BACK ELECTRONIC DISPLAY AND STATIC DISPLAY

CROSS-REFERENCE TO RELATED APPLICATIONS

This application claims priority to U.S. application Ser. No. 12/618,104 filed on Nov. 13, 2009, herein incorporated by reference in its entirety.

BACKGROUND OF THE INVENTIVE FIELD

Electronic displays are now being used for not only indoor entertainment purposes, but are now being utilized for indoor and outdoor advertising/informational purposes. For example, liquid crystal displays (LCDs), plasma displays, light emitting diode (LED), electroluminescence, light-emitting polymers, organic light emitting diode displays (OLEDs) and many other flat panel displays can now be used to display information and advertising materials to consumers in locations outside of their own home or within airports, arenas, transit stations, stadiums, restaurants/bars, gas station pumps, billboards, and even moving displays on the tops of automobiles or on the sides of trucks.

The rapid development of flat panel displays has allowed users to mount these displays in a variety of locations that were not previously available. Further, the popularity of high definition (HD) television has increased the demand for larger and brighter displays, especially large displays which are capable of producing HD video. The highly competitive field of consumer advertising has also increased the demand for large, attention-grabbing, bright displays. Displays which can provide these features typically contain a number of advanced electronic assemblies, which over time, can fail or degrade in performance. Once these displays are mounted in the user's desired position, replacing any failed electronic assemblies can be a costly and time-consuming process. Typically, the display must be removed from its mounted position so that it can be serviced. Removing the display can be very expensive and time consuming, especially in highly trafficked and difficult-to-access areas. Further, replacement of certain parts may require a 'clean room' environment.

In some applications it is now desirable to place an electronic display in a back-to-back orientation with a static display. In many applications, the static display is serviced by a first advertising party and the electronic display is serviced by a second advertising party.

SUMMARY OF THE GENERAL INVENTIVE CONCEPT

The exemplary embodiments provide a isolated access assembly for an electronic display and static display which are placed in a back-to-back orientation. A central housing may contain the electronic display and is fixed in place. A front door may be hingedly attached to the central housing where the front door is controlled by a first locking mechanism. A static display assembly may be hingedly attached to the central housing where the static display assembly is controlled by a second locking mechanism. A rear door may be hingedly attached to the static display assembly and may be controlled by a third locking mechanism.

Access to the first and second locking mechanism may be provided to a first advertising party while access to the third locking mechanism may be provided to a second advertising party. In this way, each party can service one display but is not able to access the interior of the opposing display.

A gutter may surround the interface between the front door and the central housing. A gutter may also surround the interface between the rear door and the static display assembly. The gutter may be sealed with a sealing material, for example a gasket.

An exemplary display can be serviced quickly, by minimally-trained personnel while the display remains in its mounted position. The end user may even service the display themselves. Especially in advertising, when displays are inoperable or malfunctioning, valuable advertising revenue can be lost. By reducing the amount of time required to access a display, any interruption of traffic (both human, auto, and rail) may be minimized.

The exemplary embodiments herein are not intended to be exhaustive or to unnecessarily limit the scope of the embodiments. The exemplary embodiments were chosen and described in order to explain the principles so that others skilled in the art may practice the embodiments. Having shown and described exemplary embodiments, those skilled in the art will realize that many variations and modifications may be made to affect the described invention. Many of those variations and modifications will provide the same result and fall within the spirit of the exemplary embodiments. It is the intention, therefore, to limit the embodiments only as indicated by the scope of the claims.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Figure 1A:
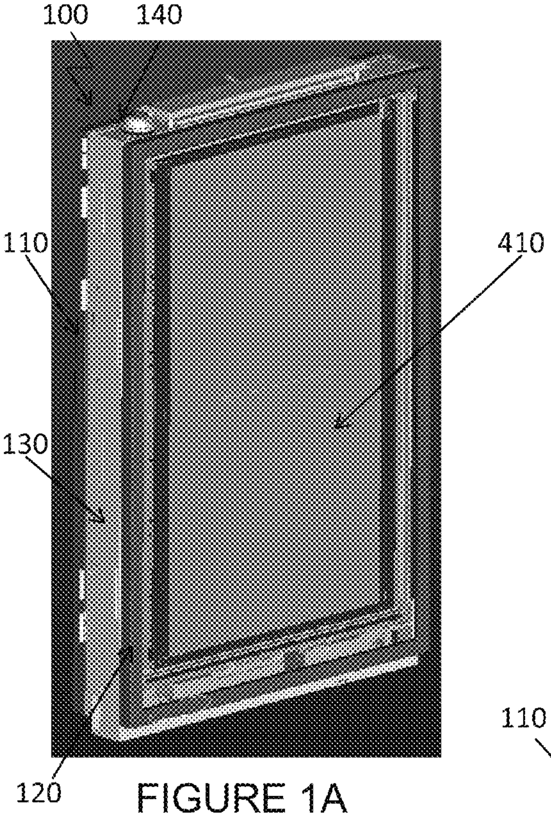
FIG. 1A provides a front perspective view of an exemplary embodiment.

FIG. 1A provides a front perspective view of an exemplary embodiment 100 for a back-to-back display setup. A front door 120 may be hingedly fastened to a central housing 130. The front door 120 may protect the electronic display 410 which may be contained within the central housing 130. A static display assembly 140 may be hingedly fastened to the opposite side of the central housing 130. A rear door 110 may be hingedly fastened to the static display assembly 140.

Figure 1B:
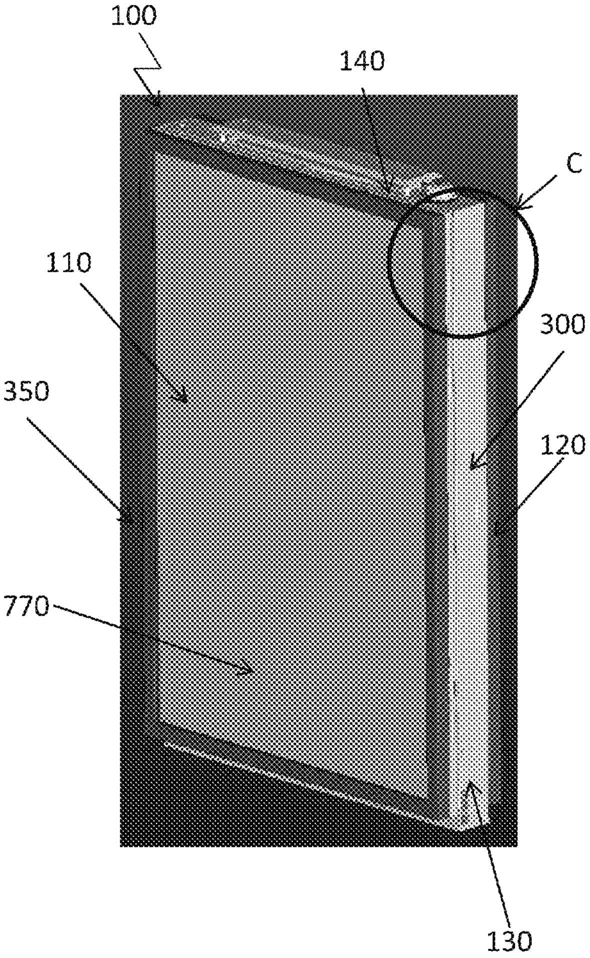
FIG. 1B provides a rear perspective view of an exemplary embodiment.

FIG. 1B provides a rear perspective view of an exemplary embodiment 100 for a back-to-back display setup. This view shows the static display assembly 140 side of the embodiment 100. A rear door 110 may protect the static display assembly 140 from damage. Detail C is shown in this figure which indicates the location for FIG. 1C described below. The central housing 130 may contain a pair of opposing vertical edges 300 and 350. The rear door 110 and the static display assembly 140 may be hingedly fastened to a first vertical edge 300. The front door 120 may be hingedly fastened to a second vertical edge 350.

Figure 1C:
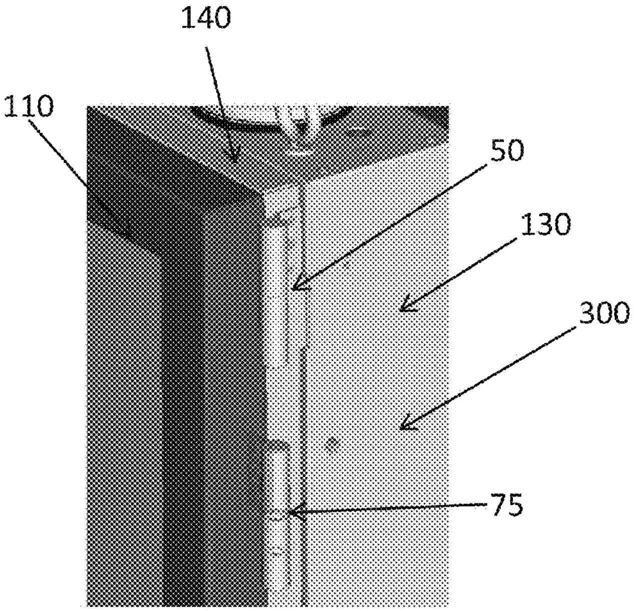
FIG. 1C provides a perspective view of detail C from FIG. 1B.

FIG. 1C provides a perspective view of detail C from FIG. 1B. Hinging mechanism 50 may be used to hingedly fasten the static display assembly 140 to the first vertical edge 300 of the central housing 130. Hinging mechanism 75 may be used to hingedly fasten the rear door 110 to the static display assembly 140. In this embodiment, the hinging mechanism 75 is located adjacent to the first vertical edge 300 of the central housing 130. However, other embodiments may place the hinging mechanism 75 adjacent to the second vertical edge 350 of the central housing 130. Additional hinging mechanisms may be used. The precise number may depend upon the size and weight of the rear door 110, static display assembly 140, and central housing 130. It is preferable to have two or more hinging mechanisms for hingedly fastening the static display assembly 140 to the first vertical edge 300 of the central housing 130 as well as hingedly fastening the rear door 110 to the static display assembly 140. In some embodiments however, a single continuous hinge may be used to hingedly fasten the static display assembly 140 to the first vertical edge 300 of the central housing 130 as well as hingedly fastening the rear door 110 to the static display assembly 140.

Figure 2:
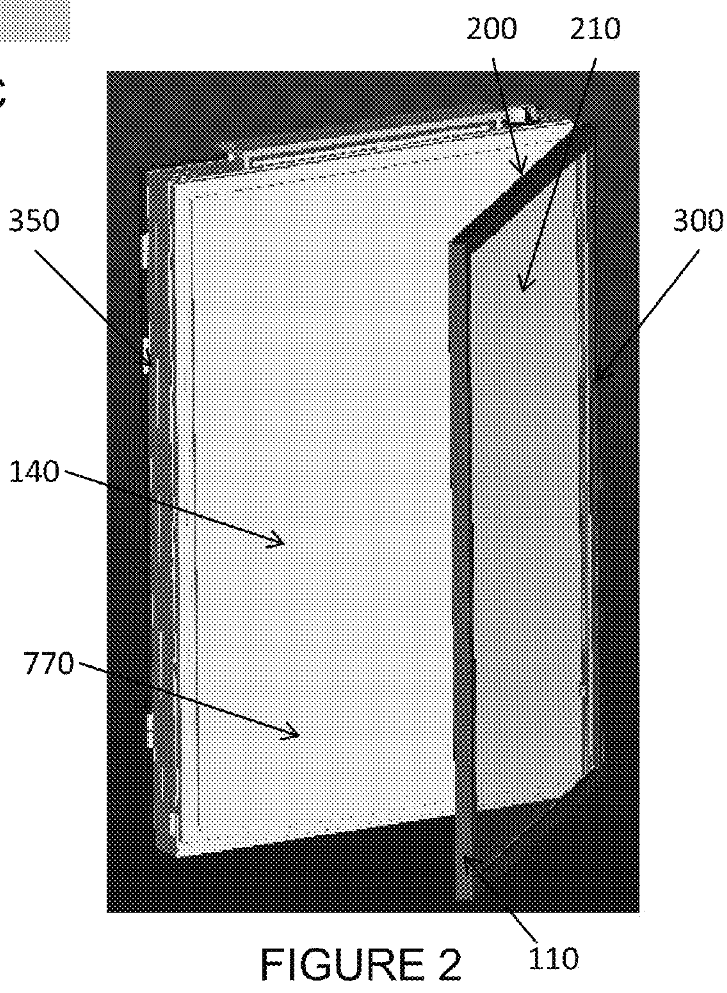
FIG. 2 provides a rear perspective view where the rear door has been unlocked and opened.

FIG. 2 provides a rear perspective view where the rear door 110 has been unlocked and opened to allow access to the static display assembly 140. The rear door 110 may contain a pane of glass 210 (or other transparent material) surrounded by a frame 200. The static display assembly 140 may contain a static graphic 770. As an example for its implementation, a first advertising party could be provided access to only the rear door 110, so that the static graphic 770 could be updated or serviced without allowing access to the electronic display 410.

Figure 3A:
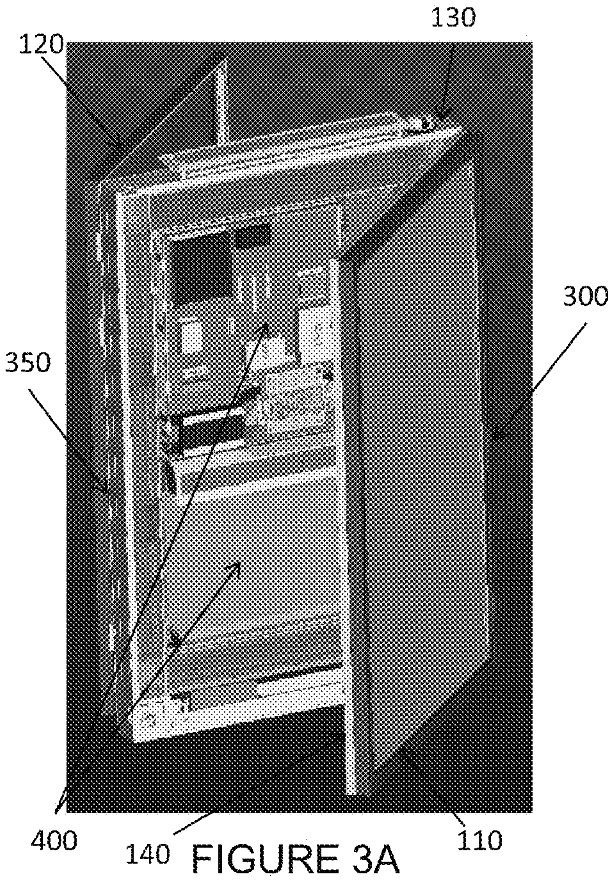
FIG. 3A provides a rear perspective view where the static display assembly and front door have been unlocked and opened.

FIG. 3A provides a rear perspective view where the static display assembly 140 and front door 120 have been unlocked and opened. In this embodiment, the static display assembly 140 is hingedly fastened to the first vertical edge 300 of the central housing 130 while the front door 120 is hingedly fastened to the second vertical edge 350 of the central housing 130. However, in other embodiments the front door 120 and static display assembly 140 may be mounted to the same vertical edge rather than opposing vertical edges.

Once the static display assembly 140 has been unlocked and opened, access to the rear portion of the electronic display 410 is provided where a second advertising party can service the various electronic components 400 associated with the electronic display 410. The various electronic components 400 may include, but are not limited to: power supplies, video cards, wireless network devices, Ethernet ports, cooling devices, LAN devices, timing and control devices (TCON), fans, backlights, and various portions of the electronic display 410 (or the entire electronic display 410).

Figure 3B:
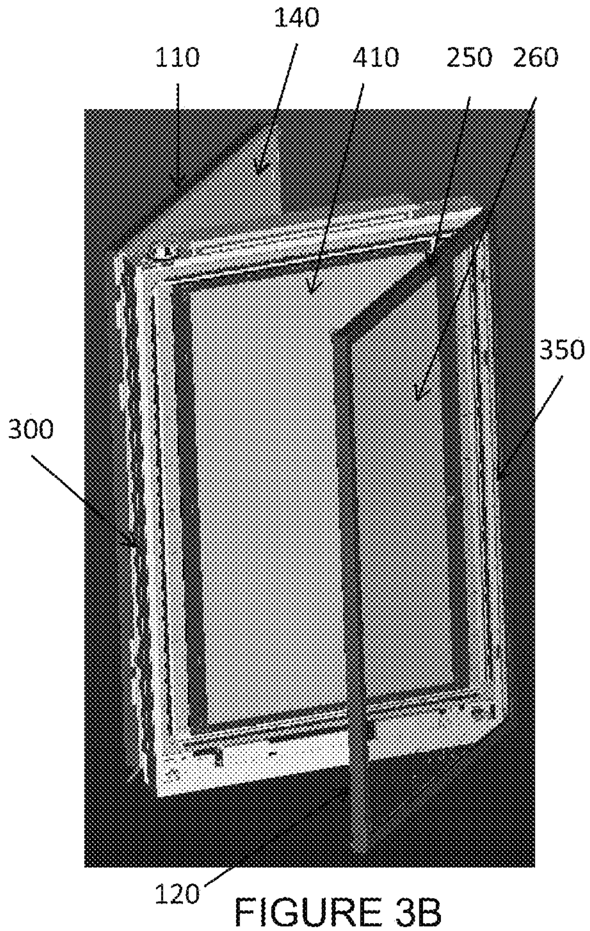
FIG. 3B provides a front perspective view where the static display assembly and front door have been unlocked and opened.

FIG. 3B provides a front perspective view where the static display assembly 140 and front door 120 have been unlocked and opened. Once the front door 120 has been unlocked and opened, access to the front portion of the electronic display 410 is provided where a second advertising party can service the electronic display 410. The front door 120 may contain one or more panes of glass 260 (or other transparent material) surrounded by a frame 250. It may be preferable that the second advertising party cannot access the static display assembly 140. Thus, FIGS. 3A and 3B show the static display assembly 140 as remaining locked with the rear door 110 to prevent the second advertising party from accessing the static graphic 770.

Similar to the rear door 110 and static display assembly 140 discussed above, it is preferable to have two or more hinging mechanisms for hingedly fastening the front door 120 to the second vertical edge 350 of the central housing 130. In some embodiments however, a single continuous hinge may be used to hingedly fasten the front door 120 to the second vertical edge 350 of the central housing 130.

Figure 4A:
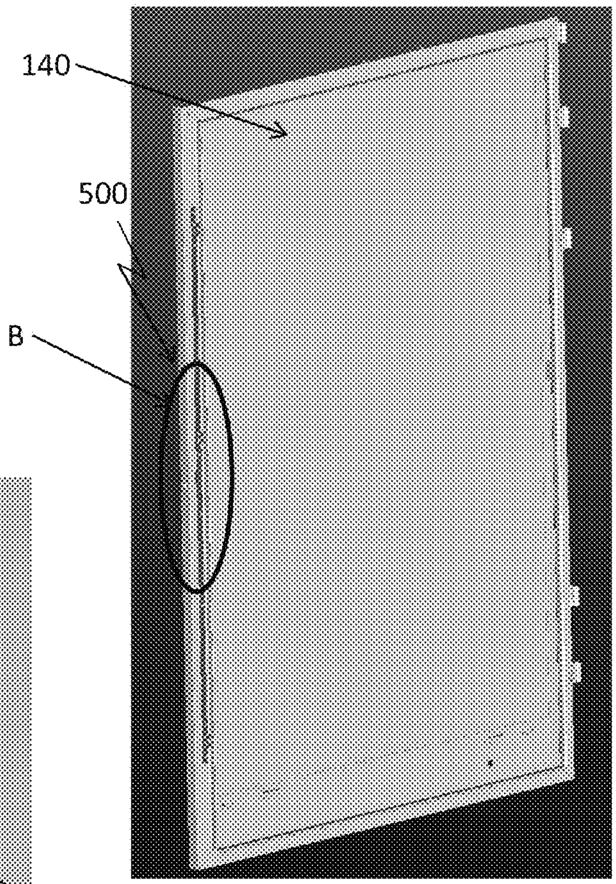
FIG. 4A provides a perspective view of an exemplary embodiment of a static display assembly and its locking mechanism.

FIG. 4A provides a perspective view of an exemplary embodiment of a static display assembly 140 and a portion of locking mechanism 500, which locks the static display assembly 140 to the rear door 110. This embodiment of the static display assembly 140 is generally planar and contains hinging mechanisms along a first vertical edge with a portion of locking mechanism 500 located along the opposing vertical edge.

Figure 4B:
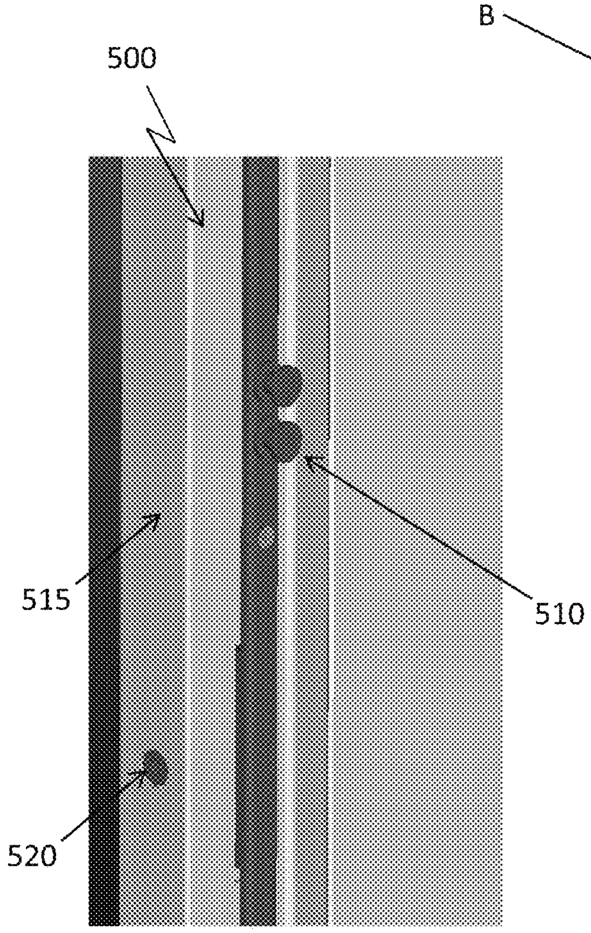
FIG. 4B provides a perspective view of detail B from FIG. 4A.

FIG. 4B provides a perspective view of detail B from FIG. 4A. Here, a detailed view for an exemplary embodiment for a portion of the locking mechanism 500 is shown. In this embodiment, a rotational motion applied at the key interface 520 causes a translational motion by one or more protrusions 510. The key interface 520 may be placed on the outer surface 515 of the static display assembly 140 so that it may be accessed when the unit is fully closed.

Figure 5A:
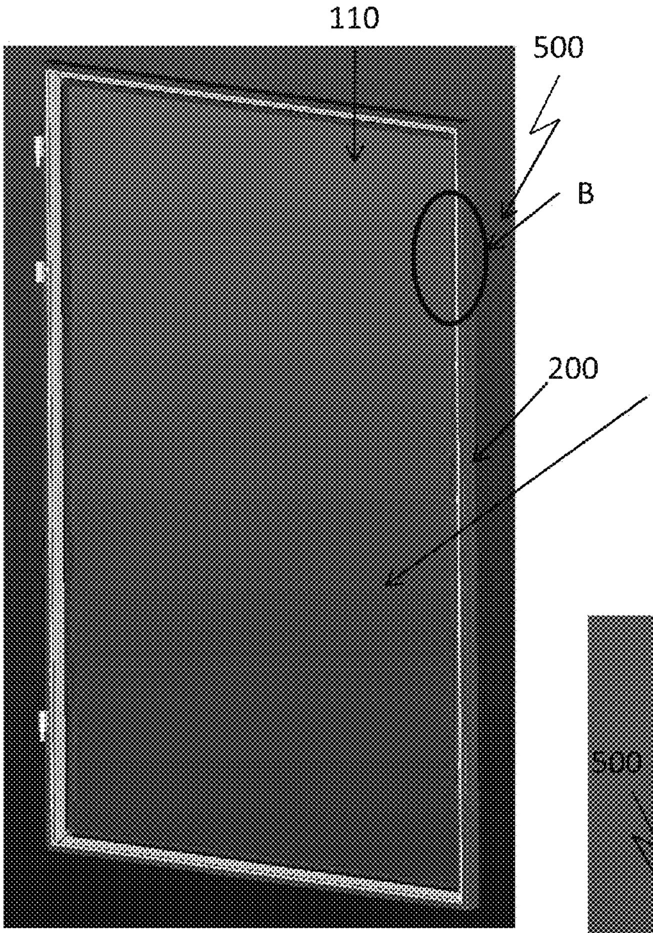
FIG. 5A provides a perspective view of an exemplary embodiment of a rear door and its locking mechanism.

FIG. 5A provides a perspective view of an exemplary embodiment of a rear door 110 and its corresponding portion of locking mechanism 500.

Figure 5B:
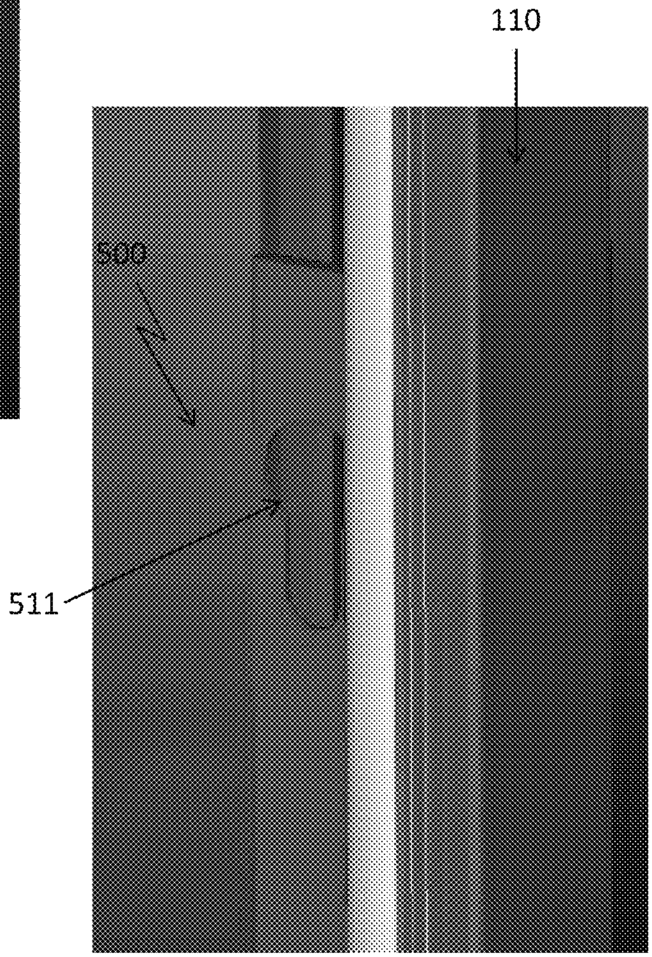
FIG. 5B provides a perspective view of detail B from FIG. 5A.

FIG. 5B provides a perspective view of detail B from FIG. 5A. In this embodiment, the rear door 110 contains an opening 511 which corresponds with the protrusion 510. In this particular embodiment, the translational motion by the protrusion 510 allows the rear door 110 to become locked with or released from the static display assembly 140. Of course, this embodiment for locking mechanism 500 is only provided as an example and is not meant to provide the only means of locking the rear door 110 with the static display assembly 140. Any locking means can be used.

Figure 6A:
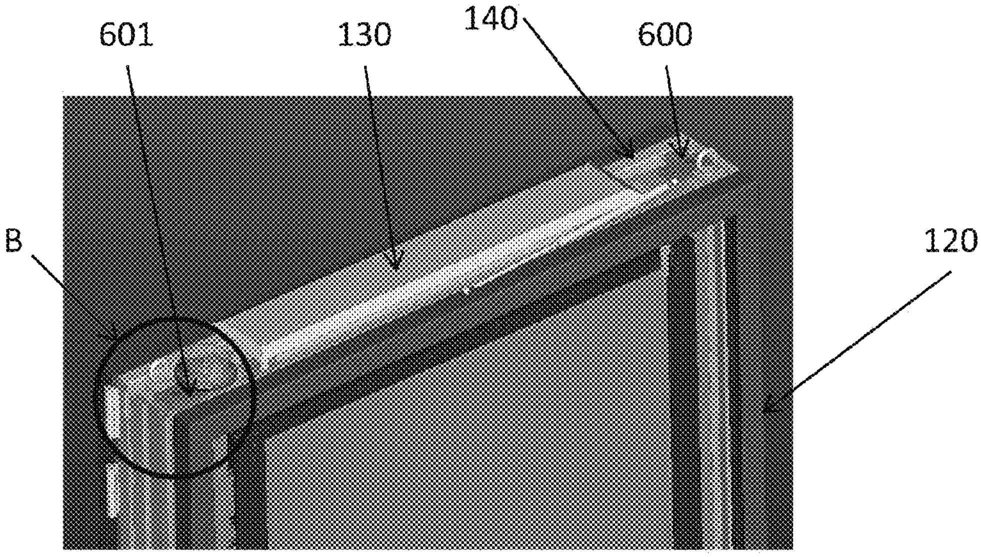
FIG. 6A provides a top perspective view of an exemplary embodiment showing the locking mechanisms for the static display assembly and the front door.

FIG. 6A provides a top perspective view of an exemplary embodiment showing the locking mechanisms for the static display assembly 140 and the front door 120. In this embodiment, locking mechanism 600 fastens the static display assembly 140 to the central housing 130. Also, locking mechanism 601 fastens the front door 120 to the central housing 130. Here, locking mechanisms 600 and 601 are placed along the top horizontal edge of the central housing 130. Some embodiments may contain an additional set of locking mechanisms along the bottom horizontal edge of the central housing 130.

Figure 6B:
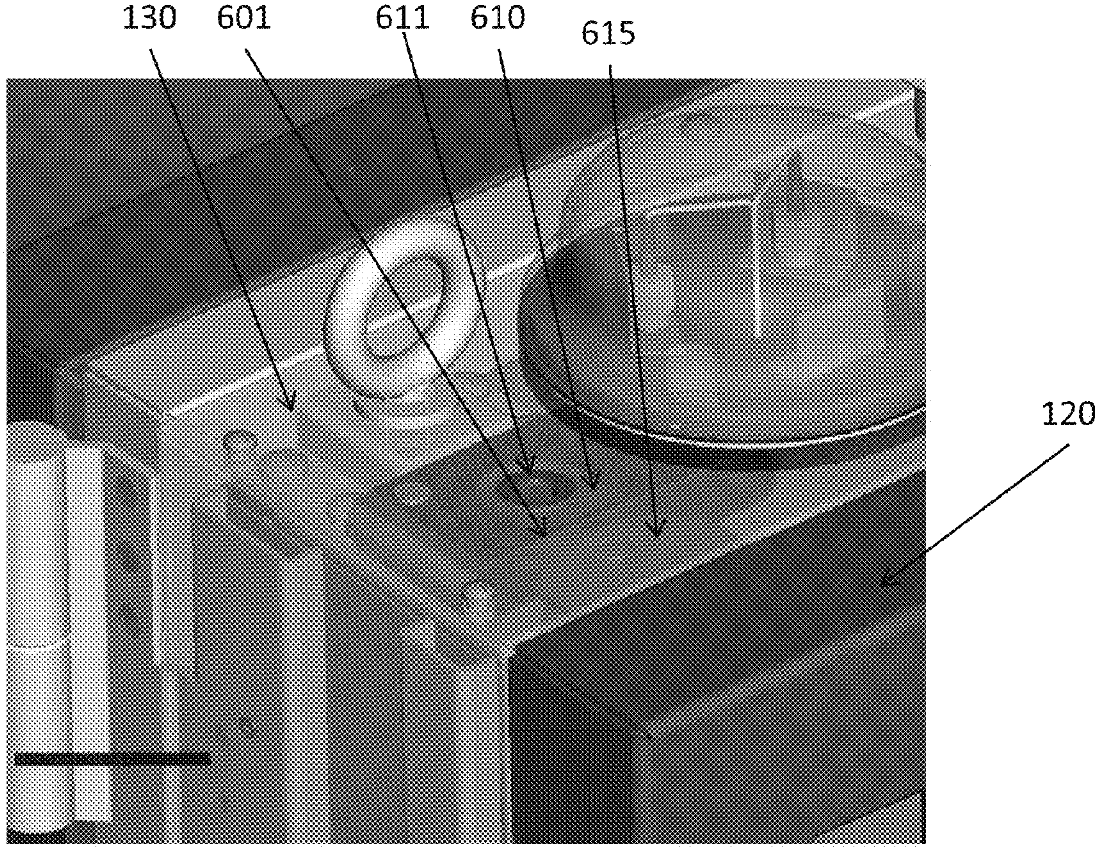
FIG. 6B provides a perspective view of detail B from FIG. 6A.

FIG. 6B provides a perspective view of detail B from FIG. 6A. A portion of the central housing 130 has been shown as transparent in order to illustrate the components of locking mechanism 601. Here, a tab or hook portion 615 is attached to the front door 120. A catching portion 610 is attached to the central housing 130. When a key is used with the key interface 611, it may cause the catching portion 610 to catch or release the tab or hook portion 615. Of course, these could be reversed, where the tab or hook portion 615 is attached to the central housing 130 while the catching portion 610 is attached to the front door 120. Other locking mechanisms can be used as well, as these particular embodiments are only provided as an example.

Figure 7:
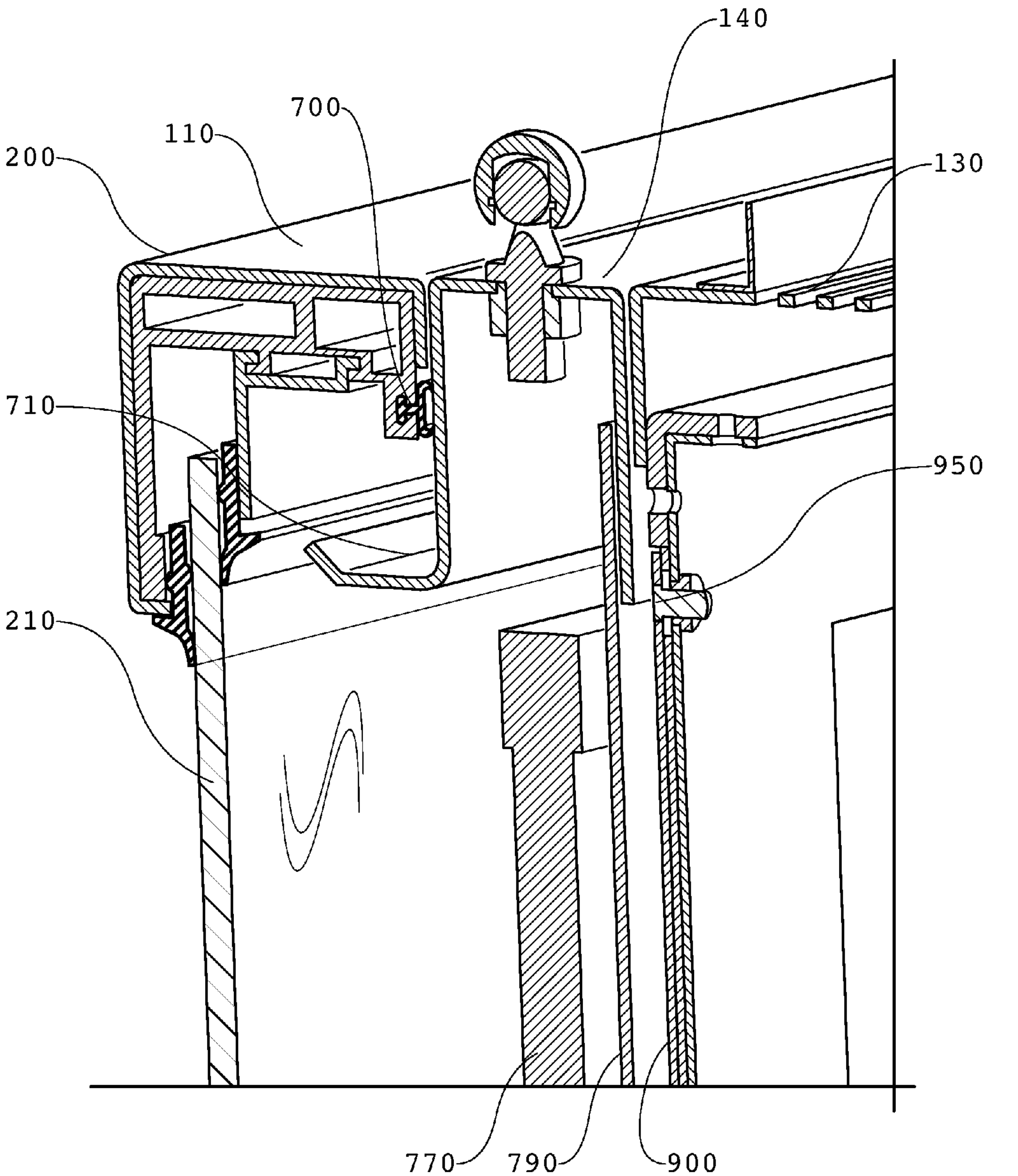
FIG. 7 provides a sectional view of the rear door, static display assembly, and central housing.

FIG. 7 provides a sectional view of the rear door 110, static display assembly 140, and central housing 130. One or more panes of glass 210 (or other transparent material) may be used to protect the static graphic 770. In an exemplary embodiment, the static graphic 770 would be backlit with some type of illumination device. In a preferred embodiment, the static graphic 770 would be backlit with an LED backlight 790. Compressible sealing material 700 may be placed between the rear door 110 and the static display assembly 140. Various types of gaskets, elastomers, or rubbers can be used for the compressible sealing material 700. A gutter 710 may be placed adjacent to the interfacing portions where the rear door 110 and static display assembly 140 meet. The gutter 710 may provide a surface for catching any water/liquid or other debris that might pass through the interfacing portions where the rear door 110 and static display assembly 140 meet.

In some embodiments, there may be a similar gutter and/or compressive sealing material placed between the static display assembly 140 and central housing 130. However, the embodiment shown in FIG. 7 does not use these elements to seal the interface of the static display assembly 140 and central housing 130. Instead, this embodiment uses a rear access plate 900 to seal the internal components of the central housing 130 from damage due to liquids or other contamination possibly entering the interface between the static display assembly 140 and central housing 130. Once the static display assembly 140 has been unlocked and hinged open, the rear access plate 900 can be removed by removing the mechanical fasteners 950 (or other suitable attachment means).

Figure 8:
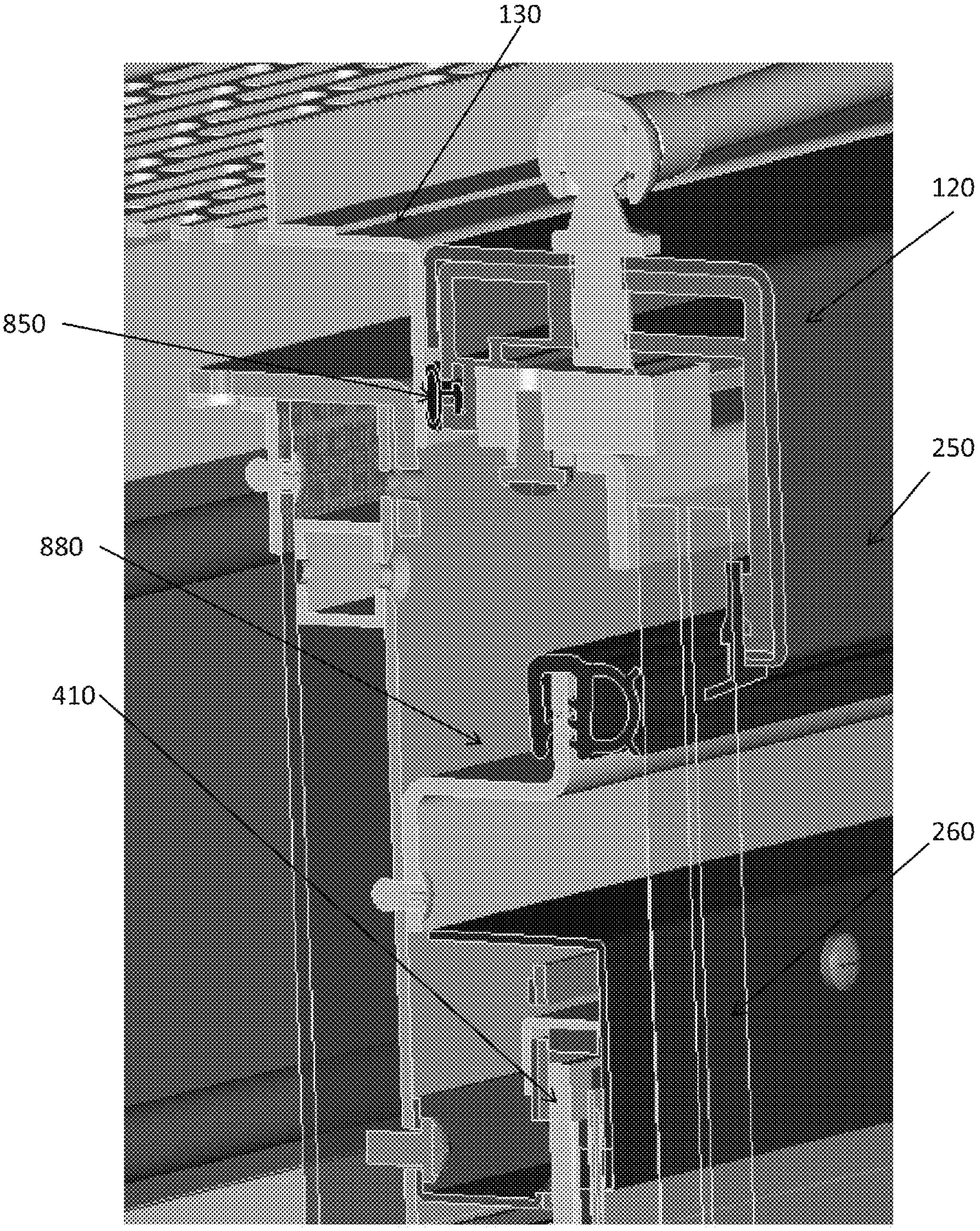
FIG. 8 provides a sectional view of the front door, electronic display assembly, and central housing.

FIG. 8 provides a sectional view of the front door 120, electronic display assembly 410, and central housing 130. One or more panes of glass 260 (or other transparent material) may be used to protect the electronic display 410, which can be any electronic assembly for displaying an image including, but not limited to: liquid crystal display (LCD), plasma, OLED, light emitting polymer (LEP), light emitting diode, and organic electro luminescence (OEL) displays. An exemplary embodiment would use an LED-backlit LCD as the electronic display 410. Compressible sealing material 850 may be placed between the central housing 130 and the front door 120. Various types of gaskets, elastomers, or rubbers can be used for the compressible sealing material 850. A gutter 880 may be placed adjacent to the interfacing portions where the front door 120 and central housing 130 meet. The gutter 880 may provide a surface for catching any water/liquid or other debris that might pass through the interfacing portions where the front door 120 and central housing 130 meet.

Figure 9:
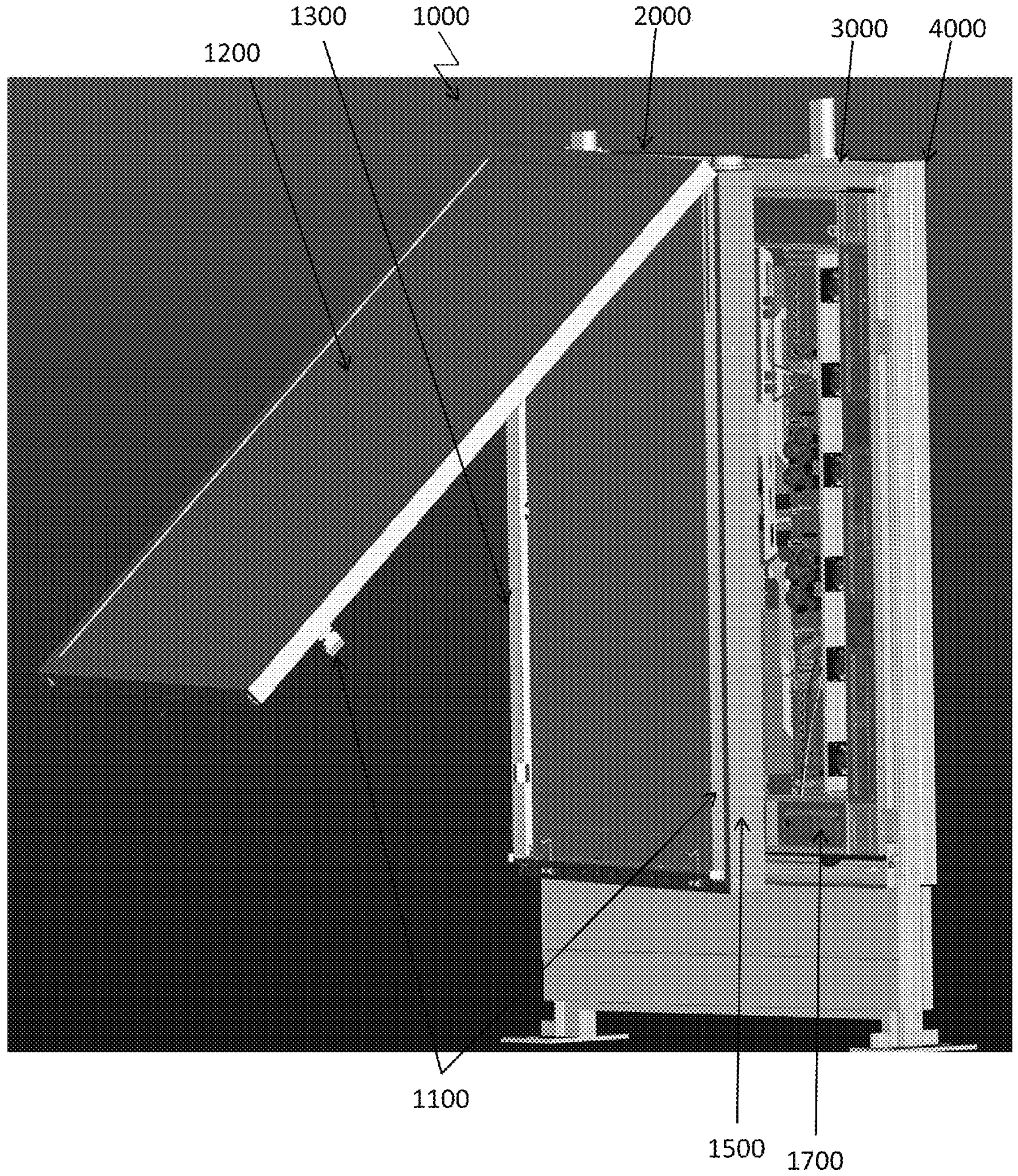
FIG. 9 provides a perspective view of another embodiment for the back-to-back assembly which hingedly fastens the rear door to the top vertical edge of the static display assembly.

FIG. 9 provides a perspective view of another embodiment for the back-to-back assembly 1000 which hingedly fastens the rear door 1200 to the top vertical edge 2000 of the static display assembly 1500. Here, the static display assembly 1500 is hingedly fastened to the vertical edge 1300 of the central housing 3000 and may be rotated to provide access to various internal electronics 1700. A locking mechanism 1100 may be used to removably fasten the rear door 1200 to the static display assembly 1500. The front door 4000 may be hingedly fastened to one of the vertical or horizontal edges of central housing 3000.

The embodiments herein allow for a back-to-back static display and electronic display to be used by two different advertising parties without letting either party access the entire assembly. The appropriate party can be given keys (or other types of access) to the various locking mechanisms so that only the appropriate level of access can be obtained. The exemplary embodiments also allow for the assembly to be placed in an outdoor environment while protecting the interior components from damage. Further, the interior components can be serviced without having to remove the entire assembly from its mounted position. While the embodiments herein have been described with respect to an electronic display placed back-to-back with a static display, one skilled in the art can easily extend these teachings to create a back-to-back design for two static displays or two electronic displays.

While certain embodiments of the present invention are described in detail above, the scope of the invention is not to be considered limited by such disclosure, and modifications are possible without departing from the spirit of the invention as evidenced by the following claims:

What is claimed is:

1. An isolated access assembly for a back-to-back electronic display and static display setup, the assembly comprising:
- a central housing which contains an electronic display;
- a front door hingedly fastened to the central housing;
- an LED backlight and graphic hingedly fastened to the central housing; and
- a rear door fastened to the LED backlight and graphic.

2. The isolated access assembly of claim 1 further comprising:
- a first locking mechanism which fastens the front door to the central housing;
- a second locking mechanism which fastens the LED backlight and graphic to the central housing; and
- a third locking mechanism which fastens the rear door to the LED backlight and graphic.

3. The isolated access assembly of claim 2 further comprising:
- a first key which unlocks the first and second locking mechanisms; and
- a second key which unlocks the third locking mechanism.

4. The isolated access assembly of claim 2 further comprising:
- a gutter between the front door and central housing.

5. The isolated access assembly of claim 4 further comprising:
- a gutter between the rear door and static display assembly.

6. The isolated access assembly of claim 5 further comprising:
- compressible sealing material between the front door and central housing.

7. The isolated access assembly of claim 1 wherein:
- the front door is hingedly fastened to the central housing;
- the LED backlight and graphic is hingedly fastened to the central housing; and the rear door is hingedly fastened to the LED backlight and graphic.

8. The isolated access assembly of claim 7 wherein:

the front door comprises a transparent window surrounded by a frame, the rear door comprises a transparent window surrounded by a frame.

9. The isolated access assembly of claim 1 wherein: the electronic display is an OLED display.

10. The isolated access assembly of claim 1 wherein: the electronic display is an OLED display.

11. An isolated access assembly for a back-to-back electronic display and LED-backlit graphic setup, the assembly comprising:

a stationary central housing having two vertical edges which connect two horizontal edges;

an electronic display with a front display surface mounted within the stationary central housing;

an LED backlight and graphic removably fastened to at least one of the vertical edges of the stationary central housing and facing approximately 180 degrees away from the front display surface of the electronic display; and a first locking mechanism which locks the LED backlight and graphic to the stationary central housing.

12. The isolated access assembly of claim 11 further comprising:

a first frame hingedly mounted to one of the vertical edges of the stationary housing and placed adjacent to the electronic display; and a first sheet of glass within the frame.

13. The isolated access assembly of claim 12 further comprising: a second frame hingedly mounted to the LED backlight and graphic; and a second sheet of glass within the frame.

14. The isolated access assembly of claim 12 further comprising:

a second locking mechanism which locks the first frame to the stationary central housing.

15. The isolated access assembly of claim 14 further comprising: a third locking mechanism which locks the second frame to the LED backlight and graphic.

16. The isolated access assembly of claim 15 further comprising: compressible sealing material between the first frame and the stationary central housing and compressible sealing material between the second frame and a static display assembly comprising the LED backlight and graphic.

17. An isolated access assembly for a back-to-back liquid crystal display and static display setup, the assembly comprising: 6 a stationary central housing having first and second vertical edges which connect top and bottom horizontal edges; an LED-backlit liquid crystal display (LCD) with a front display surface mounted within the stationary central housing; a static display assembly comprising an LED backlit graphic, the display assembly hingedly fastened to the first vertical edge of the stationary central housing and facing the opposite direction as the front display surface of the LCD, the static display assembly having first and second vertical edges where the first vertical edge of the static display assembly is attached to the first vertical edge of the stationary central housing; a first pair of locking mechanisms along the top and bottom horizontal edges of the stationary central housing which lock the static display assembly to the stationary central housing; a first frame hingedly mounted to the second vertical edge of the stationary housing and placed in front of the front display surface of the LCD; a first sheet of glass within the first frame; a second pair of locking mechanisms along the top and bottom horizontal edges of the stationary central housing which lock the first frame to the stationary central housing; compressible sealing material between the first frame and the stationary central housing; a second frame hingedly mounted to the first vertical edge of the static display assembly; a second sheet of glass within the second frame; a locking means along the second vertical edge of the static display assembly which locks the second frame to the static display assembly; and compressible sealing material between the second frame and the static display assembly.

* * * * *